United States Patent [19]

Niigaki et al.

[11] Patent Number: 4,605,600
[45] Date of Patent: Aug. 12, 1986

[54] TRANSPARENT GAAS PHOTOELECTRIC LAYER

[75] Inventors: Minoru Niigaki; Tokuaki Nihashi; Masashi Ohta, all of Hamamatsu, Japan

[73] Assignee: Hamamatsu Photonics Kabushiki Kaisha, Hamamatsu, Japan

[21] Appl. No.: 729,160

[22] Filed: Apr. 30, 1985

[30] Foreign Application Priority Data

May 8, 1984 [JP] Japan .................................. 59-91500

[51] Int. Cl.$^4$ .............................................. B32B 9/00
[52] U.S. Cl. .................... 428/689; 428/697; 428/699; 428/700; 156/600
[58] Field of Search .............. 428/700, 699, 688, 689, 428/697; 156/610, 614, 616 A, 600

[56] References Cited

U.S. PATENT DOCUMENTS 3,862,859  1/1975  Ettenberg et al. .................. 117/215
4,404,265  9/1983  Manasevit .......................... 428/689

OTHER PUBLICATIONS

"An Improved GaAs Transmission Photocathode," Allenson et al., J. Phys. D.: Appln. Phy., vol. 5, 1972.

Primary Examiner—Marion C. McCamish
Assistant Examiner—Susan S. Rucker
Attorney, Agent, or Firm—Spencer & Frank

[57] ABSTRACT

Disclosed is a new type of transparent GaAs photo electric layer formed on an optical window made of a GaP single crystal substrate via an $Al_xGa_{(1-x)}As$ buffer layer, in which a gradual-lattice-constant layer of quadruple $Al_xGa_{(1-x)}P_yAs_{(1-y)}$ compound crystal is formed between the GaP single crystal substrate and the $Al_xGa_{(1-x)}As$ buffer layer. The y content in the gradual-lattice-constant layer of quadruple $Al_xGa_{(1-x)}P_yAs_{(1-y)}$ compound crystal changes from 1 to 0 as deposition of the gradual-lattice-constant layer of quadruple $Al_xGa_{(1-x)}P_yAs_{(1-y)}$ compound crystal goes on while the x content can arbitrarily be selected in the range of 0 to 1.

3 Claims, 2 Drawing Figures

TRANSPARENT GAAS PHOTOELECTRIC LAYER

BACKGROUND OF THE INVENTION

The present invention relates to the transparent GaAs photoelectric layer with a window made of a GaP single crystal substrate.

The transparent GaAs photoelectric layer which can be used for the image pick-up device is keenly desired.

The transparent GaAs photoelectric layer has a quantum efficiency higher than the conventionally used alkaline photoelectric layer over the wavelengths from the visible rays to the near infrared rays.

The transparent GaAs photoelectric layer when used in the image pick-up device has a sensitivity higher than the conventionally used alkaline photoelectric layer under the low illumination conditions, and this high sensitivity allows the transparent GaAs photoelectric layer to be used for the nocturnal shot camera.

The conventional transparent GaAs photoelectric layer will be described referring to FIG. 1.

FIG. 1 is an extended cross-sectional view of the conventional transparent GaAs photoelectric layer. The conventional transparent GaAs photoelectric layer has been fabricated in the following manner:

Buffer layer 2 consisting of an $Al_xGa_{(1-x)}As$ crystal is grown onto a GaP single crystal substrate 1 by means of liquid-phase crystal growth. GaAs electron emission layer 3 if formed on the $Al_xGa_{(1-x)}As$ buffer layer 2 by means of crystal growth.

Distortion caused by disorder in the crystal lattice between GaP single crystal substrate 1 and $Al_xGa_{(1-x)}As$ buffer layer 2 cannot be absorbed within $Al_xGa_{(1-x)}As$ buffer layer 2. This type of disorder causes GaAs electron emission layer 3 to be distorted. Thus, the transparent GaAs photoelectric layer with satisfactory surface structure and high quality cannot be obtained in the conventional transparent GaAs photoelectric layer, and it cannot be used for making the satisfactory image pick-up device.

The objective of the invention is to present a transparent GaAs photoelectric layer with satisfactory performance solving the problems.

SUMMARY OF THE INVENTION

The transparent GaAs photoelectric layer in accordance with the present invention provides a buffer layer made of $Al_xGa_{(1-x)}As$ and an optical window formed by the GaP single crystal substrate, wherein a gradual-lattice-constant layer made of a quadruple $Al_xGa_{(1-x)}PyAs_{(1-y)}$ compound crystal is formed between the GaP single crystal substrate and the $Al_xGa_{(1-x)}As$ buffer layer. A gradual-lattice-constant layer made of a quadruple $Al_xGa_{(1-x)}PyAs_{(1-y)}$ compound crystal between the GaP single crystal substrate and the $Al_xGa_{(1-x)}As$ buffer layer, absorbing crystal lattice disorder, can be used for making a transparent GaAs photoelectric layer with satisfactory surface structure and high quality.

PREFERRED EMBODIMENT

A preferred embodiment of the present invention will be described hereafter referring to the illustration.

Figure 1:
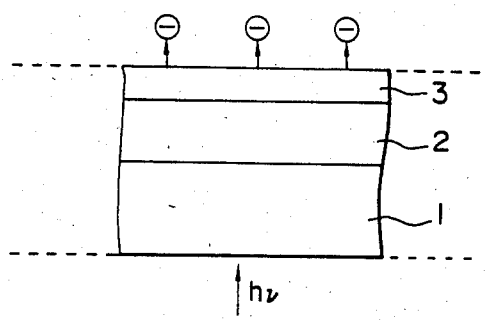
FIG. 1 is a cross-sectional extended view of the conventional transparent GaAs photoelectric layer.
Figure 2:
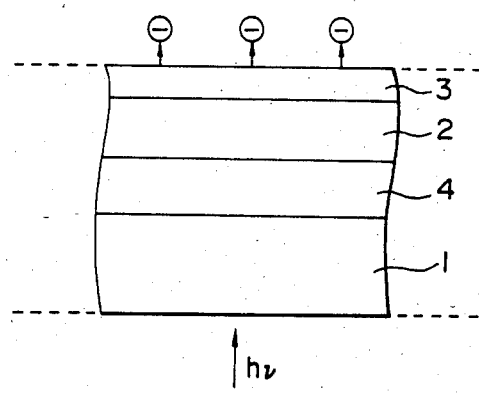
FIG. 2 is a cross-sectional extended view of the transparent GaAs photoelectric layer according to the present invention.

FIG. 2 is a cross-sectional extended view of the transparent GaAs photoelectric layer according to the present invention.

The window is made of GaP single crystal substrate 1 which is made of the same material as that used in the conventional transparent GaAs photoelectric layer mentioned above.

A gradual-lattice-constant layer made of $Al_xGa_{(1-x)}PyAs_{(1-y)}$ is formed on GaP single crystal substrate 1 by means of metal organic vapor phase epitaxy. $PH_3$ and $AsH_3$ are used as source materials for P and As in the metal organic vapor phase epitaxy, respectively. $PH_3$ and $AsH_3$ are held in the vapor phase. If the ratio of flow of $PH_3$ to $AsH_3$ is controlled, an $Al_xGa_{(1-x)}PyAs_{(1-y)}$ compound with the y content is the range of 0 to 1 can arbitrarily be formed.

Gradual-lattice-constant layer 4 of a quadruple $Al_xGa_{(1-x)}PyAs_{(1-y)}$ compound has a y content which gradually changes from 0 to 1 in the direction of thickness from $Al_xGa_{(1-x)}As$ buffer layer 2 to GaP single crystal substrate 1. This gradual y-content change absorbs inter-lattice disorder of crystals between GaP and $Al_xGa_{(1-x)}As$.

The value of "x" in a quadruple $Al_xGa_{(1-x)}PyAs_{(1-y)}$ can favorably be set at the same x content as that in $Al_xGa_{(1-x)}As$ buffer layer 2.

After formation of a quadruple $Al_xGa_{(1-x)}PyAs_{(1-y)}$ compound crystal, $Al_xGa_{(1-x)}As$ buffer layer 2 is formed.

If the x content in layer 2 is controlled, the shortest threshold wavelength for the photoelectric layer sensitivity can arbitrarily be selected.

The lattice constant of $Al_xGa_{(1-x)}As$ buffer layer 2 mates with that of GaAs electron emission layer 3 at an arbitrary x content is gradual-lattice-constant layer 4 is formed between GaAs single crystal substrate 1 and $Al_xGa_{(1-x)}As$ buffer layer 2.

GaAs electron emission layer 3 is formed onto $Al_xGa_{(1-x)}As$ buffer layer by means of crystal deposition.

The film thickness of P-type GaAs electron emission layer 3 is preferably of the order of the diffusion length of the minority carrier.

As described heretofore, the transparent GaAs photoelectric layer in accordance with the present invention provides a gradual-lattice-constant layer made of quadruple $Al_xGa_{(1-x)}PyAs_{(1-y)}$ compound crystal formed between a GaP single crystal substrate and an $Al_xGa_{(1-x)}As$ buffer layer. Inter-lattice disorder of crystals between the GaP single crystal substrate and $Al_xGa_{(1-x)}As$ buffer layer can be absorbed by the gradual-lattice-constant layer.

Distortion caused by the lattice constant disorder is thus suppressed to such an extent that which cannot effectively be found in the GaAs electron emission layer, and the transparent GaAs photoelectric layer with such satisfactory surface structure and high quality characteristics as those which have never been actualized before can be obtained by the techniques of the present invention.

What is claimed is:

1. A transparent GaAs photoelectric layer formed on an optical window made of a GaP single crystal substrate via an $Al_xGa_{(1-x)}As$ buffer layer, characterized in that:

a gradual-lattice-constant layer of quadruple $Al_xGa_{(1-x)}PyAs_{(1-y)}$ compound crystal is formed between said GaP single crystal substrate and said $Al_xGa_{(1-x)}As$ buffer layer.

2. A transparent GaAs photoelectric layer as claimed in claim 1, wherein the y content is said gradual-lattice-constant layer of quadruple $Al_xGa_{(1-x)}PyAs_{(1-y)}$ compound crystal gradually changes from 1 to 0 as deposition of said gradual-lattice-constant layer of $Al_xGa_{(1-x)}PyAs_{(1-y)}$ compound crystal goes on.

3. A transparent GaAs photoelectric layer as claimed in claim 1, wherein said gradual-lattice-constant layer quadruple $Al_xGa_{(1-x)}PyAs_{(1-y)}$ compound crystal layer is formed by means of a metal organic vapor phase epitaxy technique.

* * * * *